United States Patent [19]

McClanahan et al.

[11] Patent Number: 5,438,167
[45] Date of Patent: Aug. 1, 1995

[54] FERRIMAGNETIC VIAS WITHIN MULTI-LAYER 3-DIMENSIONAL STRUCTURES/SUBSTRATES

[75] Inventors: Robert F. McClanahan, Valencia; Robert D. Washburn, Malibu; Hal D. Smith, Rancho Palos Verdes; Andrew Shapiro, Orange, all of Calif.

[73] Assignee: Hughes Aircraft Company, Los Angeles, Calif.

[21] Appl. No.: 141,291

[22] Filed: Oct. 19, 1993

Related U.S. Application Data

[63] Continuation-in-part of Ser. No. 951,072, Sep. 24, 1992, abandoned.

[51] Int. Cl.6 ................................................ H05K 1/00
[52] U.S. Cl. ................................. 174/264; 174/35 R; 174/262; 361/792; 361/816
[58] Field of Search .................... 174/35 R, 250, 258, 174/262, 263, 264, 265, 266; 361/784, 790, 792, 816

[56] References Cited

U.S. PATENT DOCUMENTS

| | | |
|---|---|---|
| 3,638,147 | 1/1972 | Denes . |
| 4,647,878 | 3/1987 | Landis et al. . |
| 4,894,114 | 1/1990 | Nathanson et al. . |
| 5,312,674 | 5/1994 | Haertling et al. ............ 428/210 |

*Primary Examiner*—Gerald P. Tolin
*Assistant Examiner*—Cheryl R. Figlin
*Attorney, Agent, or Firm*—L. A. Alkov; W. K. Denson-Low

[57] ABSTRACT

Ferrimagnetic structures formed of ferrimagnetic vias in a unitized multilayer microcircuit structure that is formed of a plurality of co-fired insulating layers.

9 Claims, 3 Drawing Sheets

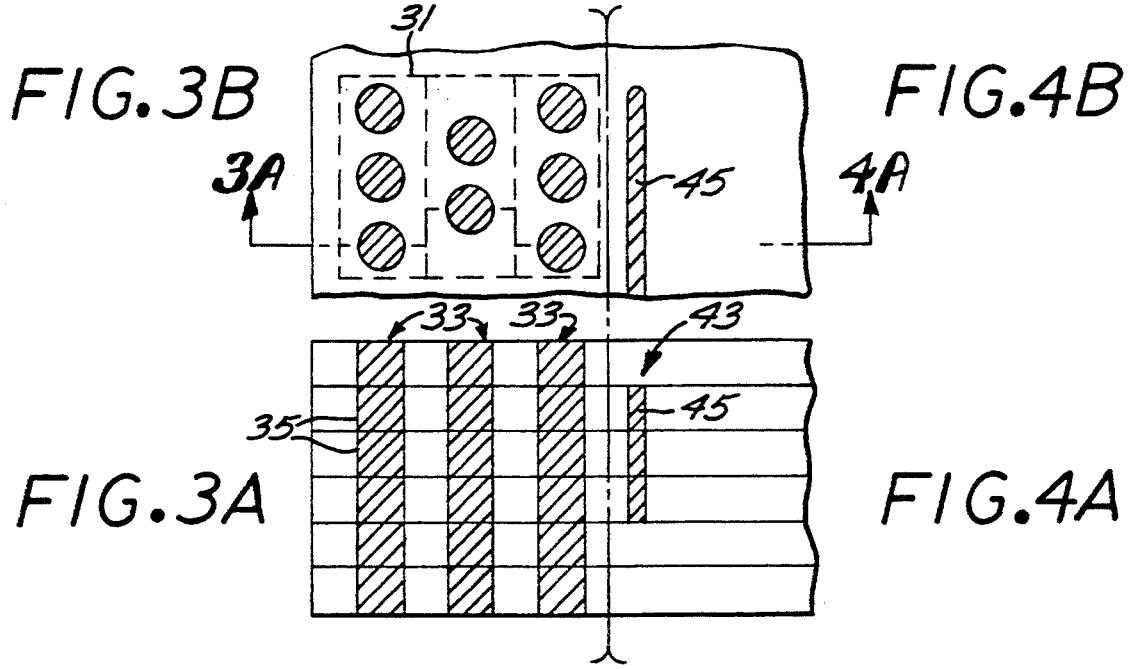
FIG.3B  FIG.4B
FIG.3A  FIG.4A
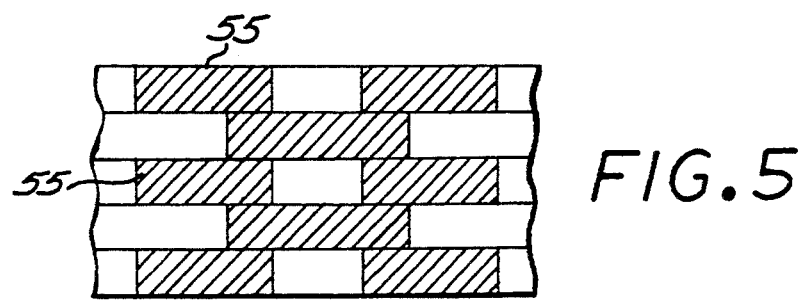
FIG.5
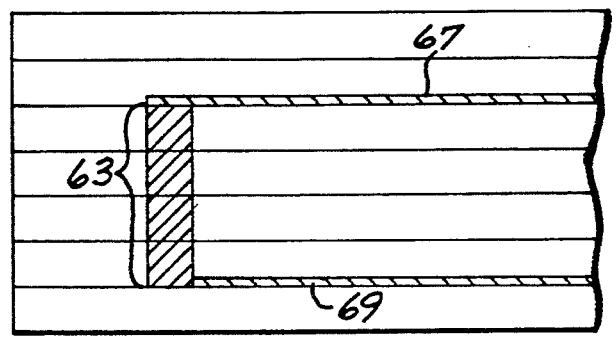
FIG.6

5,438,167

FERRIMAGNETIC VIAS WITHIN MULTI-LAYER 3-DIMENSIONAL STRUCTURES/SUBSTRATES

This is a continuation-in-part of application Ser. No. 07/951,072, filed Sep. 24, 1992, abandoned.

BACKGROUND OF THE INVENTION

The disclosed invention is directed generally to hybrid multilayer circuit structures, and is directed more particularly to hybrid multilayer circuit structures having ferrimagnetic via structures formed therein.

Hybrid multilayer circuit structures, also known as hybrid microcircuits, implement the interconnection and packaging of discrete circuit devices, and generally include a unitized multilayer circuit structure either formed on a single substrate layer using thick film or thin film techniques, or as a multilayer substrate comprising a plurality of integrally fused insulating layers (e.g., ceramic layers) having conductor traces disposed therebetween. The discrete circuit devices (e.g., integrated circuits) are commonly mounted on the top insulating layer so as not to be covered by another insulating layer or on a insulating layer having die cutouts formed thereon to provide cavities for the discrete devices. Passive components such as capacitors, inductors, and resistors can be formed on the same layer that supports the discrete devices, for example, by thick film processes, or they can be formed between the insulating layers, for example, also by thick film processes. Electrical interconnection of the conductors and components on the different layers is achieved with vias or-holes appropriately located and formed in the insulating layers and filled with conductive material, whereby the conductive material is in contact with predetermined conductive traces between the layers that extend over or under the vias.

Magnetic structures comprised of ferromagnetic and ferrimagnetic materials have been utilized with unitized multiayer circuit structures in the form of discrete external components or structures, which makes the resulting product relatively large and heavy. While ferromagnetic materials have been incorporated in unitized multilayer circuit structures, such materials are conductors which may not be suitable for many applications. Moreover, known processes for incorporating ferromagnetic materials in unitized multilayer circuit structures are incompatible with the formation of unitized multilayer circuit structures using a single sintering process such is used with Low Temperature Cofired Ceramic Tape (LTCC).

Ferrimagnetic materials are typically poor electrical conductors, and that characteristic has been exploited for magnetic shielding or enhancing the performance of inductors and transformer structures. Ferrimagnetic inks and ferromagnetic inks have been developed for use with thick film processes, but the magnetic enhancement realized through the use of ferrimagnetic inks and ferromagnetic inks is limited by the achievable thickness of the ink printing since performance in a closed magnetic path is dependent on the cross sectional area of the magnetic material. Moreover, such known ferrimagnetic inks and ferromagnetic inks are incompatible with LTCC or similar processing due to shrinkage profile dissimilarities between the known inks and LTCC, which causes warping and buckling of the multilayer circuit structure during firing.

SUMMARY OF THE INVENTION

It would therefore be an advantage to provide for ferrimagnetic structures that can be implemented in unitized multilayer circuit structures.

Another advantage would be to provide for ferrimagnetic structures that can be implemented with co-fired unitized multilayer circuit structure fabrication processes.

The foregoing and other advantages are provided by the invention with ferrimagnetic structures comprising ferrimagnetic via fills in a unitized multilayer circuit structure.

BRIEF DESCRIPTION OF THE DRAWINGS

The advantages and features of the disclosed invention will readily be appreciated by persons skilled in the art from the following detailed description when read in conjunction with the drawing wherein:

FIGS. 3A and 3B schematically depict ferrimagnetic via structures in accordance with the invention for EMI isolation and shielding.

FIGS. 4A and 4B schematically depict an isolation ferrimagnetic via structure in accordance with the invention.

FIG. 5 schematically depicts a further isolation ferrimagnetic via structure in accordance with the invention.

FIG. 6 schematically depicts an isolation ferrimagnetic via structure in accordance with the invention which provides for vertical as well as lateral isolation.

DETAILED DESCRIPTION OF THE DISCLOSURE

Figure 1A:
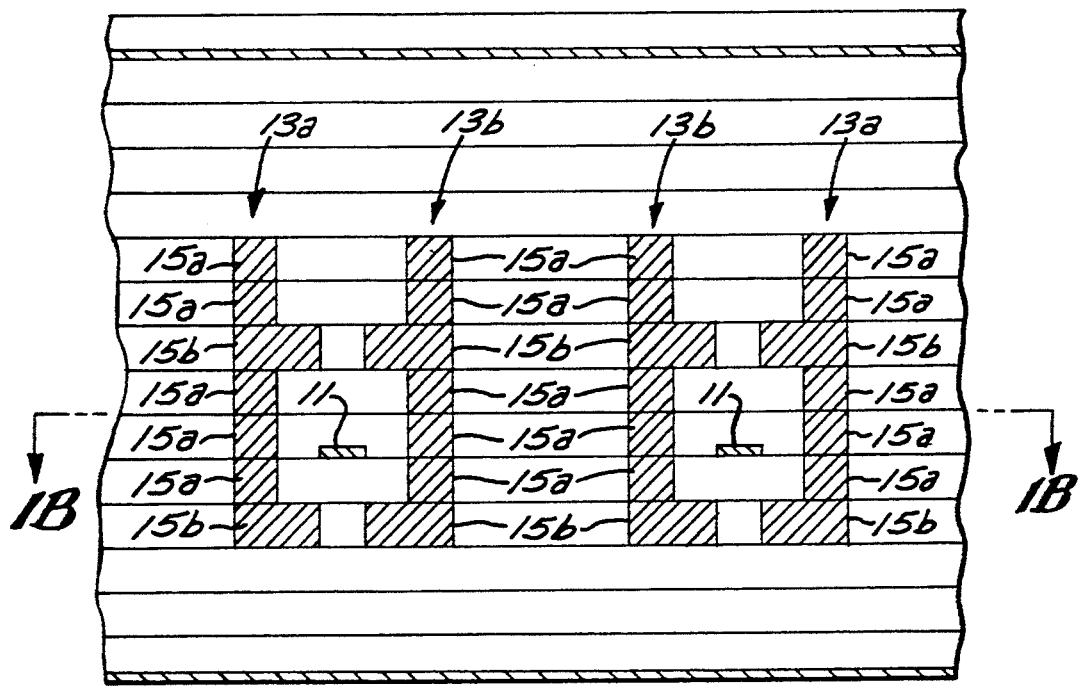
FIGS. 1A and 1B schematically depict ferrimagnetic via structures in accordance with the invention arranged along a microstrip inductance.

In the following detailed description and in the several figures of the drawing, like elements are identified with like reference numerals.

Ferrimagnetic via structures in accordance with the invention are implemented in a unitized multilayer circuit structure that is utilized for interconnecting various discrete circuits mounted on the outside thereof. The unitized multilayer circuit structure is formed from a plurality of insulating layers (comprising ceramic, for example), conductive traces disposed between the insulating layers, and conductive vias formed in the layers which together with any buried elements (e.g., elements formed on the top of an insulating layer and covered by an overlying insulating layer) are processed to form an integrally fused unitized multilayer structure. The discrete circuits are typically mounted and electrically connected on the outside of the unitized multilayer circuit structure after the unitizing fabrication.

In accordance with the invention, 3-dimensional ferrimagnetic structures that include ferrimagnetic coatings or via fills are formed in a unitized multilayer structure in different arrangements to achieve a variety of purposes. Appropriate via openings for the ferrimagnetic structures are formed in individual layers, for example by conventional techniques such as mechanical or laser drilling, together with via openings for other types of materials such as conductive via fills As used herein, "ferrimagnetic" refers to compounds in which some ions have a magnetic moment aniparallel to other ions. An example of ferrimagnetic compounds are ferrites which are a class of magnetic oxides where a divalent cation (such as Cd, Cu, Co, Fe, Mg, Ni and Zn) is chemically bonded to an $OFe_2O_3$ structure. While ferrimagnetic compounds are typically poor electrical conductors, they cannot be used as typical dielectrics.

The via openings for the ferrimagnetic via structures can be of different sizes and shapes to achieve a variety of special purposes, and can include narrow elongated via openings for line via structures. Large via openings may require radiused corners to maintain structural integrity of the ultimate unitized multilayer circuit structure. The via openings for the ferrimagnetic structures can be coated or filled with ferrimagnetic material by conventional via fill techniques such as screen printing, for example. Via coating may be appropriate only for relatively small volumes of magnetic material. The ferrimagnetic material used to fill the via openings must be compatible with the material of the insulating layers throughout the fabrication process, and the ferrimagnetic structures must not introduce major structural weakness into the unitized multilayer structure. An example of a compatible low temperature co-fired ceramic (LTCC) tape and ferrite ink combination is Dupont 851AT ceramic tape and ESL-EX2000 ferrite ink. The tape manufacturers recommended processing can be used including the burn-out and firing profile.

The incorporation of 3-dimensional ferrimagnetic structures into a unitized multilayer circuit offers a wide variety of benefits and expanded capabilities including improved inductors and transformers, reduction of electromagnetic interference (EMI), magnetic field concentration and control, and non-linear devices (such as circulators, isolators, phase shifters, directional couplers and other saturating magnetic devices), while minimizing the need to add discrete external ferrimagnetic components. Improved transformer performance is achieved by (i) minimizing leakage inductance by controlling the magnetic flux path, and (ii) reducing conductor loss for a given inductance value since fewer turns are required.

Figure 1B:
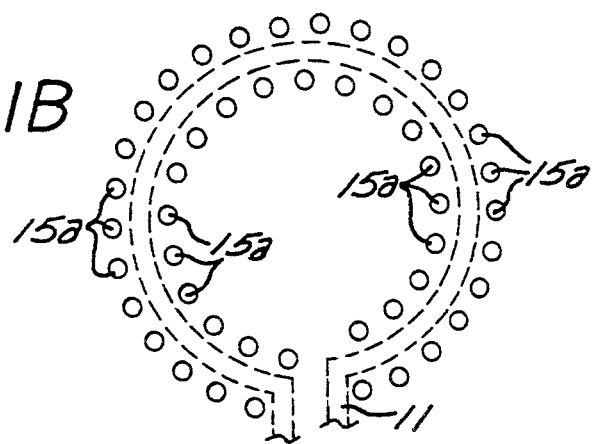

Referring now to FIGS. 1A and 1B, schematically depicted therein are ferrimagnetic structures utilized with and distributed along the length of a ring shaped microstrip inductance 11. Each ferrimagnetic structure comprises a pair of ferrimagnetic via columns 13a, 13b located on each side of the microstrip inductance 11. The via columns 13a, 13b of each ferrimagnetic structure are generally coplanar and extend several layers above and below the microstrip inductance 11. As specifically shown in FIG. 1B, the ferrimagnetic columns 13a, 13b of each ferrimagnetic structure comprise respective stacks of ferrimagnetic vias that include narrow vias 15a and inwardly extending vias 15b that are above the microstrip inductance 11 and inwardly extending lower wider vias below the microstrip inductance. The narrow vias 15a can comprise, for example, circular vias. The inwardly extending vias 15b comprise, for example, circular vias or line vias whose length is represented in FIG. 1A and whose width is perpendicular to the plane of the figure and can be about equal to the diameter of narrow vias 15a.

Inwardly extending vias 15b and the intervening narrow vias 15a of each ferrimagnetic structure generally form opposing C-shaped ferrimagnetic structures that partially circumscribe the microstrip inductance 11. Further narrow ferrimagnetic vias 15a can extend upwardly from the inwardly extending vias 15b. Essentially, each ferrimagnetic structure comprises a plurality of ferrimagnetic vias 15 arranged to partially circumscribe the microstrip inductance 11. The smaller gaps between the inwardly extending vias 15b may be advantageous in a particular application.

While the foregoing 3-dimensional ferrimagnetic via structure has been described in the context of a ring shaped microstrip inductance, it should be appreciated that the ferrimagnetic structures can be implemented with other inductance structures wherein the partially circumscribing ferrimagnetic via structures are distributed along the contour of a microstrip or stripline inductance.

The ferrimagnetic structure depicted in FIGS. 1A and 1B functions to enhance inductance and minimize losses due to circulating currents induced in the ground planes. The presence of ferrimagnetic vias provides a preferential media and concentration of magnetic field lines, which minimizes filed line interception by the ground plane of the unitized multilayer circuit structure and the resulting induced currents and losses. As a result of the ferrimagnetic structure, higher inductance values are achieved, inductors for a specific value can be shorter, and higher Q is obtained.

Figure 2:
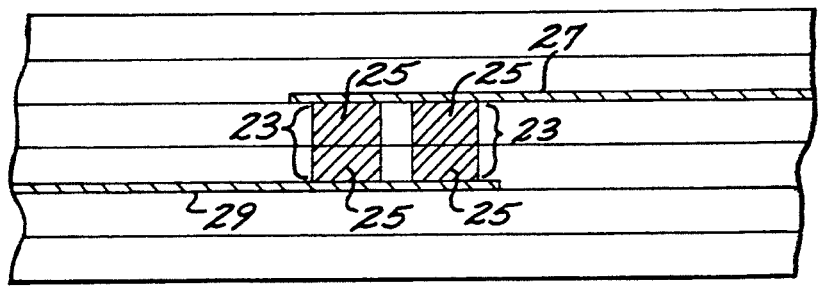
FIG. 2 schematically depicts a 3-dimensional ferrimagnetic via structure in accordance with the invention for increasing mutual coupling between coupled lines.

Referring now to FIG. 2, set forth therein is a 3-dimensional ferrimagnetic via structure for increasing mutual coupling between coupled lines 27, 29. The ferrimagnetic via structure includes a plurality of short ferrimagnetic via columns 23 formed in the overlap region of coupled lines 27, 29 that are on different insulating layers. Each of the ferrimagnetic via columns 23 comprises a stack of ferrimagnetic vias 25. The ferrimagnetic structure allows for improved power transfer, improved impedance transformation, as well as feedback mechanisms and paths within the multilayer circuit structure, in a smaller structure.

A further application of 3-dimensional ferrimagnetic via structures in accordance with the invention is for EMI isolation and shielding. Schematically depicted in FIGS. 3A and 3B is an isolation ferrimagnetic via structure that includes a plurality of rows 31 of ferrimagnetic via columns 33, wherein each column comprises a stack of ferrimagnetic vias 35. The rows 31 of ferrimagnetic columns 33 essentially form a ferrimagnetic isolation region whose vertical and longitudinal extent (which is normal to plane of FIG. 3A) will depend on the required isolation. The rows of ferrimagnetic via columns can be arranged linearly with or without bends or along a contour that is non-linear as viewed in plan view. Depending upon the application, the ferrimagnetic via columns can extend from the bottom insulating layer through the top insulating layer, or they can be contained in certain contiguous internal layers.

Schematically depicted in FIGS. 4A and 4B is an isolation ferrimagnetic via structure line structure that includes a vertical stack 43 of line vias 45 each of which has a length that is greater than its width. Depending upon the specific application, a plurality of vertical stacks of line vias 45 can be used to provide isolation.

The line vias 45 can be configured to have bends and/or follow non-linear contours.

FIG. 5 schematically depicts a further isolation ferrimagnetic via structure that includes a plurality ferrimagnetic vias 55, which can be circular vias or line vias, for example, arranged in an interlinked grid wherein a ferrimagnetic via in a given layer is partially overlapping and staggered relative to any overlying or underlying ferrimagnetic via. For example, the grid includes vertically aligned vias in first alternating layers and vertically aligned vias in second layers, such that the vias in the first alternating layers overlap the vias in the second alternating layers. As shown in FIG. 5 the first or second alternating layers can have one more group of vertically aligned vias than the other alternating layers. The grid can also be extended in the direction normal to the plane of FIG. 4. The isolation structure of FIG. 4 essentially forms a ferrimagnetic isolation region whose specific dimensions will depend on the required isolation, similarly to the isolation ferrimagnetic structure of FIGS. 3A and 3B. The interlinked grid can be arranged to follow a planar surface or a non-planar surface.

The isolation structures of FIGS. 3–5 can be used to provide shielding on the edges of the substrate, or to isolate circuits in one portion of the multilayer structure from circuits in another portion of the multilayer structure. A ferrimagnetic structure can be arranged with bends and/or curves to partially or fully enclose circuits in the multilayer structure.

Referring now to FIG. 6, schematically depicted therein is a ferrimagnetic isolation structure that provides for vertical as well as lateral isolation. A row of ferrimagnetic via columns 63 is located between corresponding terminal edges of first and second planar ferrimagnetic layers 67, 69, wherein such row includes a plurality of via columns arranged similarly to one of the via column rows in the structure of FIG. 3B. The ferrimagnetic layers 67, 69 are formed by screen printing a compatible ferrite ink on the associated insulating layers. Depending upon the application, the isolation structure between the first and second planar ferrimagnetic layers can extend along further corresponding edges of the planar layers as required. The isolation structure between the first and second planar ferrimagnetic layers can also comprise multiple rows of ferrimagnetic via columns as described above relative to FIGS. 3A and 3B, or an interlinked ferrimagnetic via grid as described above relative to FIG. 4, As a further alternative, a ferrimagnetic line via wall structure as described above relative to FIG. 5 could also be utilized with the first and second planar ferrimagnetic layers.

Figure 7A:
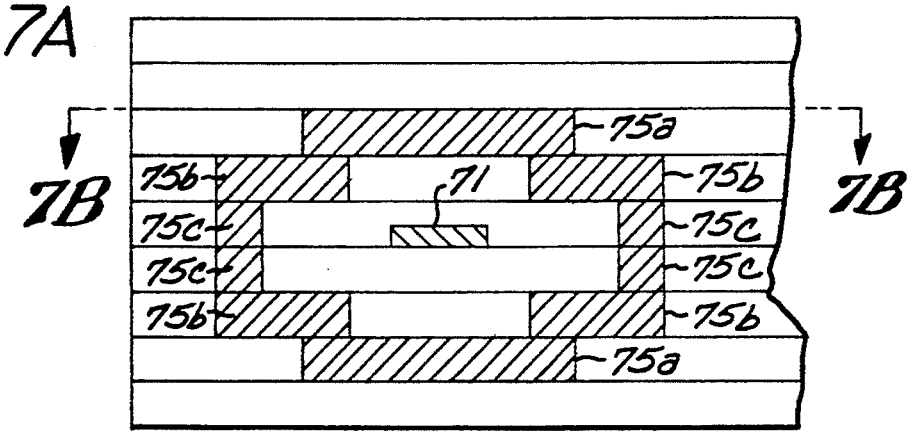
FIG. 7A and 7B schematically depict a ferrimagnetic via band in accordance with the invention which encircles a conductive trace for changing line impedance.
Figure 7B:
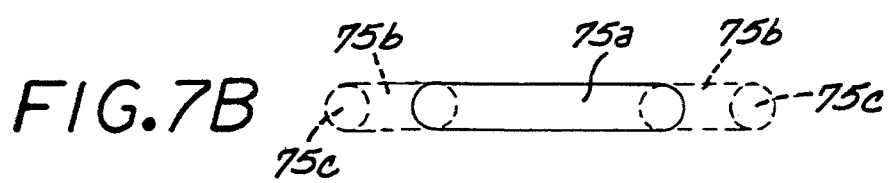

Referring now to FIG. 7, schematically depicted therein is a ferrimagnetic via band that encircles a conductive trace 71 for changing line impedance. The ferrimagnetic via band comprises a plurality of interlinked ferrimagnetic vias 75a, 75b, 75c of different lateral dimensions arranged so that a continuous band of ferrimagnetic material fully encircles the conductive trace. For increased current handling, parallel conductor traces can be utilized with common ferrimagnetic bands or separate ferrimagnetic bands. The vias 75a, 75b, 75c can comprise circular vias of different diameters or a combination of line vias for the vias 75a, 75b of greater lateral dimension, and circular vias for the vias 75c of lesser lateral dimension, as depicted in FIG. 7B. In the configuration that includes line vias and circular vias, the widths of the line vias can be about the same as the diameter of the circular vias, for example.

Figure 8A:
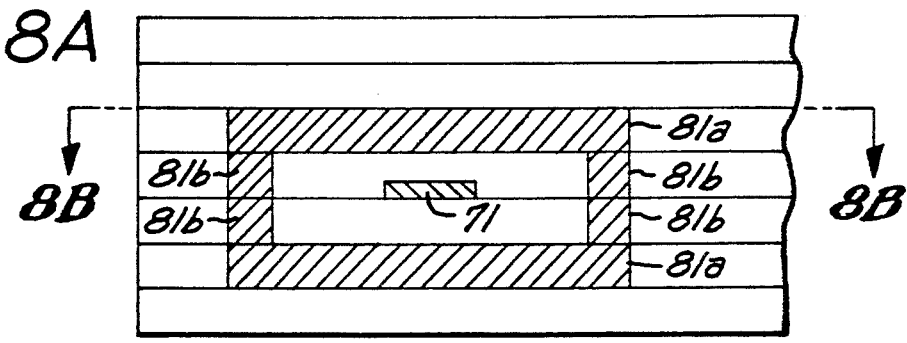
FIGS. 8A and 8B schematically depict a further ferrimagnetic band in accordance with the invention which includes vias of different lateral dimensions.
Figure 8B:
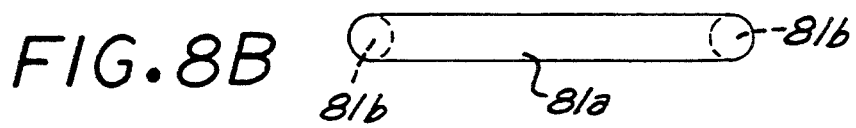

FIGS. 8A and 8B schematically depict a further embodiment of a ferrimagnetic band that includes vias of different lateral dimensions, wherein top and bottom vias 81a have greater lateral dimensions than vias 81b arranged in respective columns at the lateral ends of the top and bottom vias 81a. As particularly depicted in FIG. 8B, the vias 81b can comprise circular vias, and the top and bottom vias 81a can comprise line vias whose widths are about the same as the diameter of the interposed circular vias.

It should be appreciated that one or more of the ferrimagnetic bands could be used on a particular line, depending upon the application and its requirements, current, frequency, material properties, and so forth. Particular applications include high frequency noise filtering, harmonic control, radiation suppression, and wave shaping.

Ferrimagnetic via structures in accordance with the invention are made, for example, pursuant to low temperature co-fired processing such as disclosed in "Development of a Low Temperature Co-fired Multilayer Ceramic Technology," by William A Vitriol et al, 1983 ISHM Proceedings, pages 593–598; "Processing and Reliability of Resistors Incorporated Within Low Temperature Co-fired Ceramic Structures," by Ramona G. Pond et al., 1986 ISHM Proceedings, pages 461–472; and "Low Temperature Co-Fireable Ceramics with Co-Fired Resistors," by H. T. Sawhill et al., 1986 ISHM Proceedings, pages 268–271.

In accordance with low temperature co-fired processing, vias are formed in a plurality of green thick film tape layers at locations defined by the desired via configurations of the desired multilayer circuit. The vias are coated or filled with the appropriate fill material, for example, by screen printing. Conductor metallization for conductive traces including the stripline conductors and the embedded ground planes are then deposited on the individual tape layers by screen printing, for example, and materials for forming passive components are deposited on the tape layers. The tape layers are laminated and fired at a temperature below 1200 degrees Celsius (typically 850 degrees Celsius) for a predetermined length of time which drives off organic materials contained in the green ceramic tape and forms a solid ceramic substrate. External metallization including the lower ground plane metallization and any side wall metallization can then be applied by known techniques.

Ferrimagnetic via structures in accordance with the invention can also be implemented with other technologies for forming unitized multilayer circuit structures, including for example high temperature co-fired ceramics, hard ceramic multilayer single firing technology, and a laminated soft substrate approach.

The foregoing has been a disclosure of ferrimagnetic structures that are advantageously incorporated in unitized multilayer circuit structures and are fabricated utilizing processes for forming unitized multilayer circuit structures.

Although the foregoing has been a description and illustration of specific embodiments of the invention, various modifications and changes thereto can be made by persons skilled in the art without departing from the scope and spirit of the invention as defined by the following claims.

What is claimed is:

1. A multilayer circuit structure comprising:

a plurality of planar ceramic co-fired insulating layers; and a plurality of ferrimagnetic vias formed in said ceramic co-fired insulating layers and defining a region that contains ferrimagnetic material, said insulating layers and said ferrimagnetic vias being integraly fused into a unitized multilayer circuit structure.

2. The multilayer circuit structure of claim 1 wherein said plurality of ferrimagnetic vias includes a plurality of columns of ferrimagnetic vias as viewed perpendicularly to the planar extent of said insulating layers.

3. The multilayer circuit structure of claim 1 wherein said plurality of ferrimagnetic vias are arranged in a grid of as viewed perpendicularly to the planar extent of said insulating layers, wherein ferrimagnetic vias in each of said plurality insulating layers are connected to ferrimagnetic vias in an adjacent one of said plurality of insulating layers.

4. The multilayer circuit structure of claim 1 wherein said plurality of ferrimagnetic vias are formed in an overlap region between coupled striplines disposed between said insulating layers and separated from each other in a direction that is perpendicular to the planar extent of said insulating layers, wherein said overlap region comprises a region that is between overlapping portions of the coupled striplines.

5. The multilayer circuit structure of claim 1 wherein said plurality of ferrimagnetic vias comprises first interconnected ferrimagnetic vias for partially surrounding a portion of a microstrip inductance and second ferrimagnetic vias for partially circumscribing a portion of the microstrip inductance.

6. The multilayer circuit structure of claim 1 wherein said plurality of ferrimagnetic vias comprises interconnected ferrimagnetic vias circumscribing a portion of a conductor.

7. A multilayer circuit structure comprising:
a plurality of planar dielectric insulating layers; and
a plurality of ferrimagnetic line vias formed in said insulating layers and defining a region that contains ferrimagnetic material, said insulating layers and said ferrimagnetic line vias being integrally fused into a unitized multilayer circuit structure.

8. The multilayer circuit structure of claim 7 wherein said plurality of ferrimagnetic line vias are arranged in a grid of as viewed perpendicularly to the planar extent of said insulating layers, wherein ferrimagnetic vias in each of said plurality of insulating layers are connected to ferrimagnetic vias in an adjacent one of said plurality of insulating layers.

9. A multilayer circuit structure comprising:
a plurality of planar dielectric insulating layers; and
a plurality of ferrimagnetic circular vias and ferrimagnetic line vias formed in said insulating layers and defining a region that contains ferrimagnetic material, said insulating layers and said ferrimagnetic vias and line vias forming part of a unitized multilayer circuit structure.

* * * * *